US011476230B2

(12) United States Patent
Homma

(10) Patent No.: US 11,476,230 B2
(45) Date of Patent: Oct. 18, 2022

(54) SEMICONDUCTOR DEVICE AND METHOD OF MANUFACTURING SEMICONDUCTOR DEVICE

(71) Applicant: KIOXIA CORPORATION, Tokyo (JP)

(72) Inventor: Soichi Homma, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/189,228

(22) Filed: Mar. 1, 2021

(65) Prior Publication Data

US 2022/0020722 A1 Jan. 20, 2022

(30) Foreign Application Priority Data

Jul. 20, 2020 (JP) .............................. JP2020-123839

(51) Int. Cl.
*H01L 23/00* (2006.01)
*H01L 25/065* (2006.01)

(52) U.S. Cl.
CPC .............. *H01L 24/81* (2013.01); *H01L 24/13* (2013.01); *H01L 24/16* (2013.01); *H01L 25/0657* (2013.01); *H01L 2224/13082* (2013.01); *H01L 2224/13111* (2013.01); *H01L 2224/13147* (2013.01); *H01L 2224/13155* (2013.01);

(Continued)

(58) Field of Classification Search
CPC ......... H01L 24/81; H01L 24/13; H01L 24/16; H01L 25/0657; H01L 2224/13082; H01L 2224/13111; H01L 2224/13147; H01L 2224/13155; H01L 2224/16227; H01L 2224/81201; H01L 2224/81815; H01L 2225/06506; H01L 2225/0651; H01L 2225/06517; H01L 2225/06562; H01L 2225/06575; H01L 2225/06582
See application file for complete search history.

(56) References Cited

U.S. PATENT DOCUMENTS 10,497,665 B2 12/2019 Ahn
2018/0240745 A1 8/2018 Lee
(Continued)

FOREIGN PATENT DOCUMENTS

CN 108461406 A 8/2018
JP 2004276098 A 10/2004

*Primary Examiner* — Douglas W Owens
(74) *Attorney, Agent, or Firm* — Kim & Stewart LLP

(57) ABSTRACT

According to one embodiment, a method of manufacturing a semiconductor device includes forming a metal bump on a first surface side of a semiconductor chip, positioning the semiconductor chip so the metal bump contacts a pad of an interconnection substrate, and applying a first light from a second surface side of the semiconductor chip and melting the metal bump with the first light. After the melting, the melted metal bump is allowed to resolidify by stopping or reducing the application of the first light. The semiconductor chip is then pressed toward the interconnection substrate. A second light is then applied from the second surface side of the semiconductor chip while the semiconductor chip is being pressed toward the interconnection substrate to melt the metal bump. After the melting, the melted metal bump is allowed to resolidify by the stopping or reducing of the application of the second light.

5 Claims, 15 Drawing Sheets

(52) U.S. Cl.
CPC .............. *H01L 2224/16227* (2013.01); *H01L 2224/81201* (2013.01); *H01L 2224/81815* (2013.01); *H01L 2225/0651* (2013.01); *H01L 2225/06506* (2013.01); *H01L 2225/06517* (2013.01); *H01L 2225/06562* (2013.01); *H01L 2225/06575* (2013.01); *H01L 2225/06582* (2013.01)

(56) References Cited

U.S. PATENT DOCUMENTS

| | | | |
|---|---|---|---|
| 2019/0051605 A1* | 2/2019 | Horibe | H01L 21/4846 |
| 2019/0103376 A1 | 4/2019 | Han et al. | |
| 2019/0279958 A1 | 9/2019 | Chen et al. | |
| 2021/0111125 A1* | 4/2021 | Chen | H01L 21/565 |
| 2022/0084971 A1* | 3/2022 | Lee | H01L 23/3178 |
| 2022/0115312 A1* | 4/2022 | Fang | H01L 21/4853 |
| 2022/0122940 A1* | 4/2022 | Baello | H01L 24/81 |

* cited by examiner

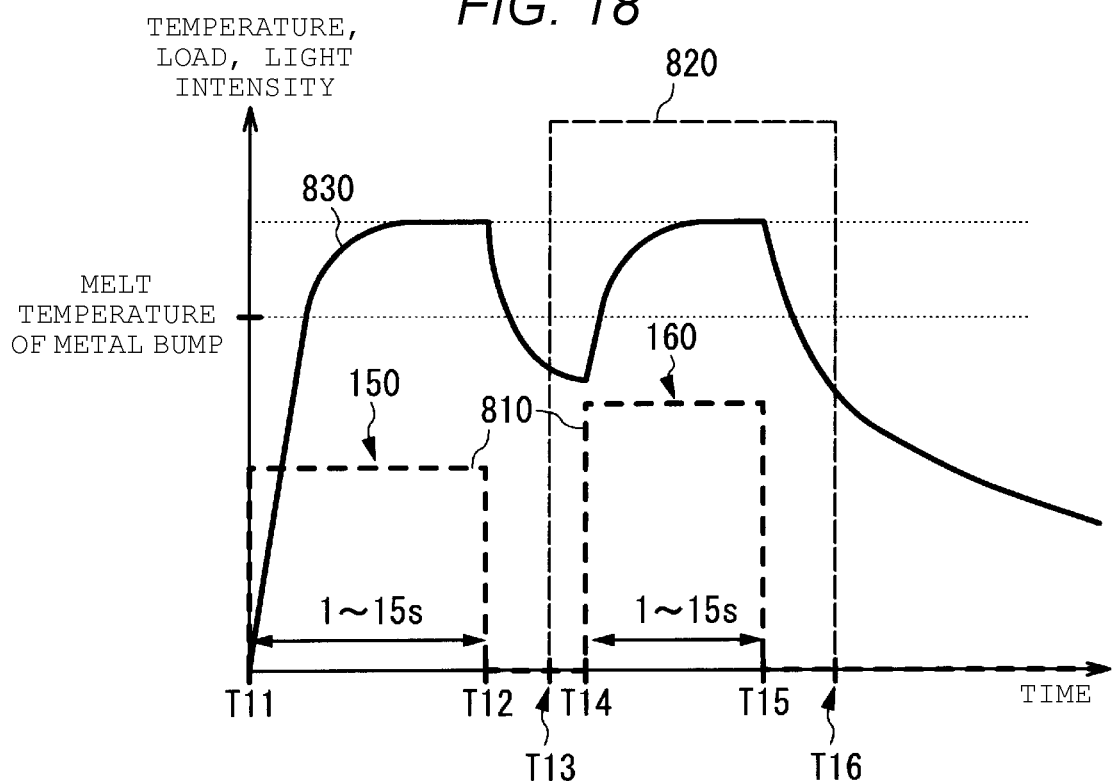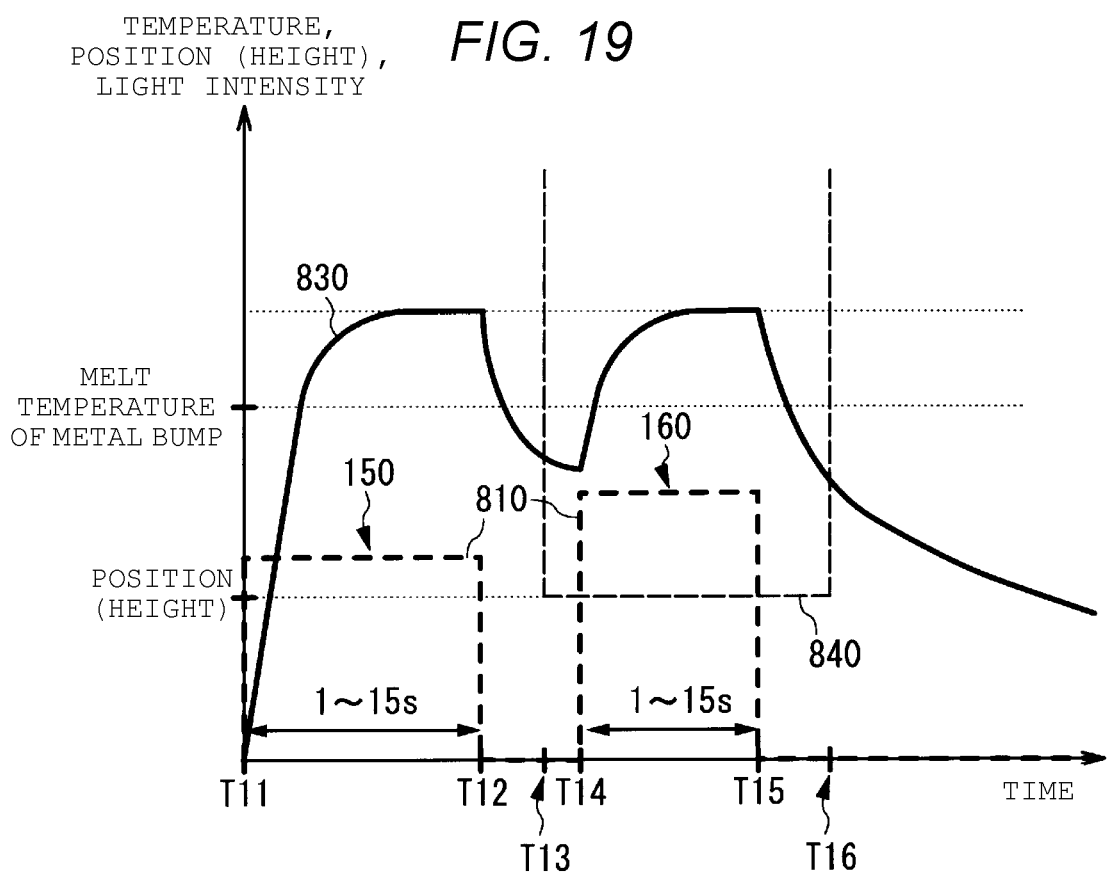

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2020-123839, filed on Jul. 20, 2020, the entire contents of which are incorporated herein by reference.

FIELD

Embodiments described herein relate generally to semiconductor devices and methods of manufacturing semiconductor devices.

BACKGROUND

A packaged semiconductor device incorporating NAND flash memory is known. As an example of such a packaged semiconductor device, there is one type in which an integrated circuit (IC) chip is mounted on a pad on an interconnection (wiring) substrate by flip-chip bonding.

BRIEF DESCRIPTION OF THE DRAWINGS

FIGS. 16-19 are timing charts illustrating aspects related to a method of connecting a metal bump and a pad by application of light in an embodiment.

DETAILED DESCRIPTION

Figure 1:
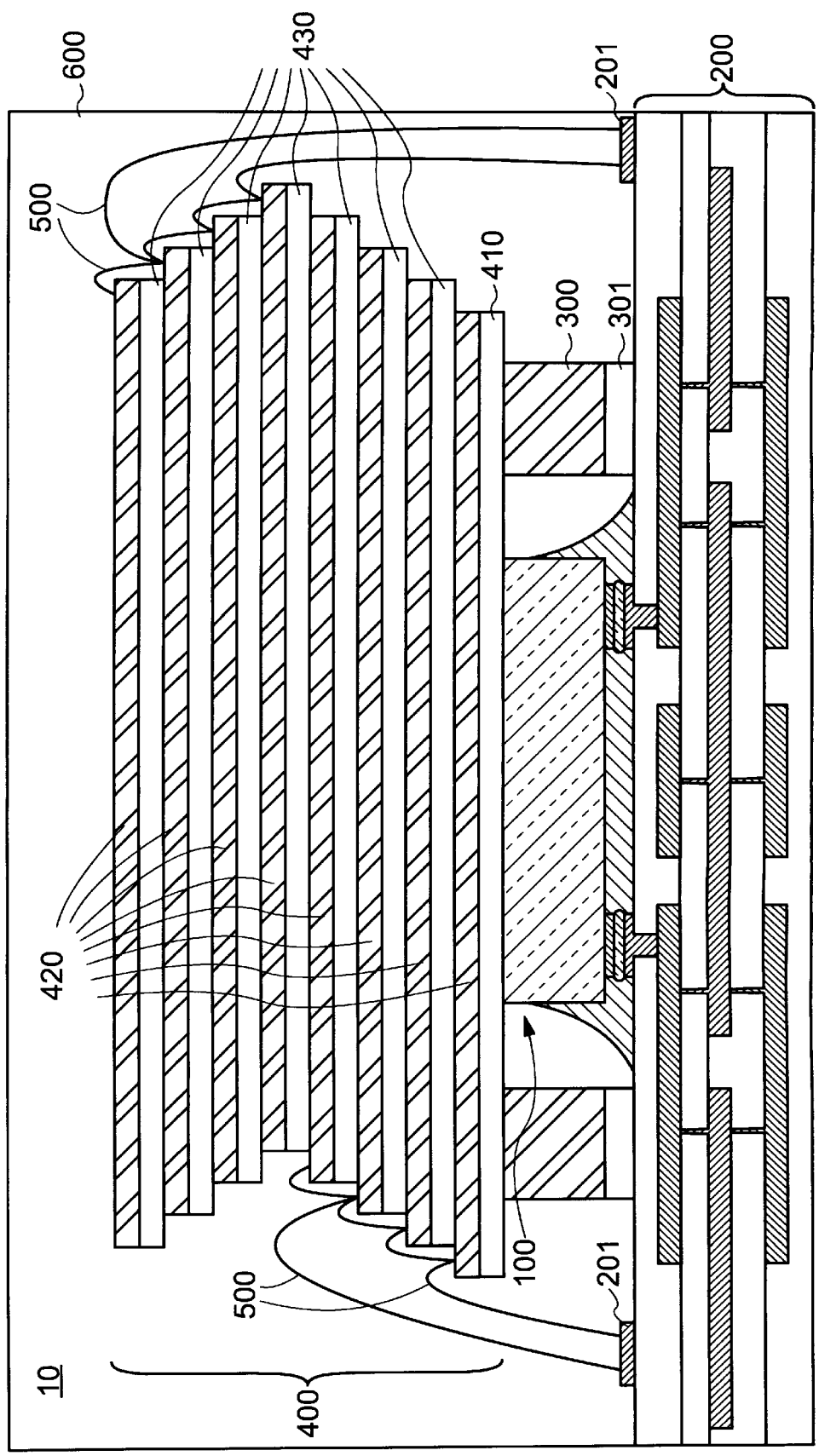
FIG. 1 is a cross-sectional view illustrating a semiconductor device according to an embodiment.

Certain embodiments illustrate a highly reliable semiconductor device. Other embodiments illustrate a mounting method of an IC chip that can perform high-accuracy alignment in flip-chip bonding without using a high-cost apparatus while reducing the effects that might otherwise be caused by warpage of the IC chip.

In general, according to one embodiment, a method of manufacturing a semiconductor device includes forming a metal bump on a first surface side of a semiconductor chip; positioning the semiconductor chip so the metal bump contacts a pad of an interconnection substrate; applying a first light from a second surface side of the semiconductor chip and melting the metal bump with the first light; allowing the melted metal bump to resolidify after melting by stopping or reducing the application of the first light; pressing the semiconductor chip toward the interconnection substrate after the stopping or reducing of the application of the first light; applying a second light from the second surface side of the semiconductor chip while pressing the semiconductor chip toward the interconnection substrate to melt the metal bump; and then allowing the melted metal bump to resolidify by stopping or reducing the application of the second light.

According to another embodiment, there is provided a semiconductor device including: a semiconductor chip provided with a first metal bump and a second metal bump provided outside the first metal bump when viewed in a plan view; and an interconnection substrate provided with a first pad connected to the first metal bump and a second pad connected to the second metal bump, in which a first compound layer containing a material of the first metal bump and a material of the first pad exists between the first metal bump and the first pad, a second compound layer containing the material of a second metal bump and a material of the second pad exists between the second metal bump and the second pad, and a thickness of the first compound layer and a thickness of the second compound layer are different from each other.

Hereinafter, a semiconductor device according to an example embodiment and related manufacturing methods will be specifically described with reference to the drawings. In the following description, elements having substantially the same function and configuration are denoted by the same reference numerals or, in some instances, the same reference numerals with added suffixes, and duplicate description of repeated aspects may be omitted. The technical concepts of reflected by the described example embodiments are not limited by the example materials, shapes, structures, arrangements, and the like of the components.

In description of the example embodiments, the direction from the interconnection substrate toward the semiconductor chip may be referred to as upward or the like. The direction from the semiconductor chip toward the interconnection substrate may be referred to as downward or the like. However, such terms like "upward" and "downward" are used for descriptive convenience of relative positioning of components and the like and no absolute orientation, such as a relationship to the direction of gravity is implied. For example, the vertical relationship between the interconnection substrate and the semiconductor chip may be arranged in the reverse direction as depicted in the drawing.

In the following description, the expression "semiconductor chip on the interconnection substrate" merely explains the positional relationship between the interconnection substrate and the semiconductor chip, and other members may be disposed between the interconnection substrate and the semiconductor chip.

In this specification, expressions such as "α includes A, B or C", "α contains any one of A, B and C", and "α includes one selected from the group consisting of A, B and C" do not exclude the case where α includes more than one of A, B, and C, unless otherwise specified. These expressions do not exclude cases where α contains other elements besides A, B, or C.

The following embodiments may be combined with each other as long as there is no technical conflict.

First Embodiment

Structure of Semiconductor Device 10

Figure 2:
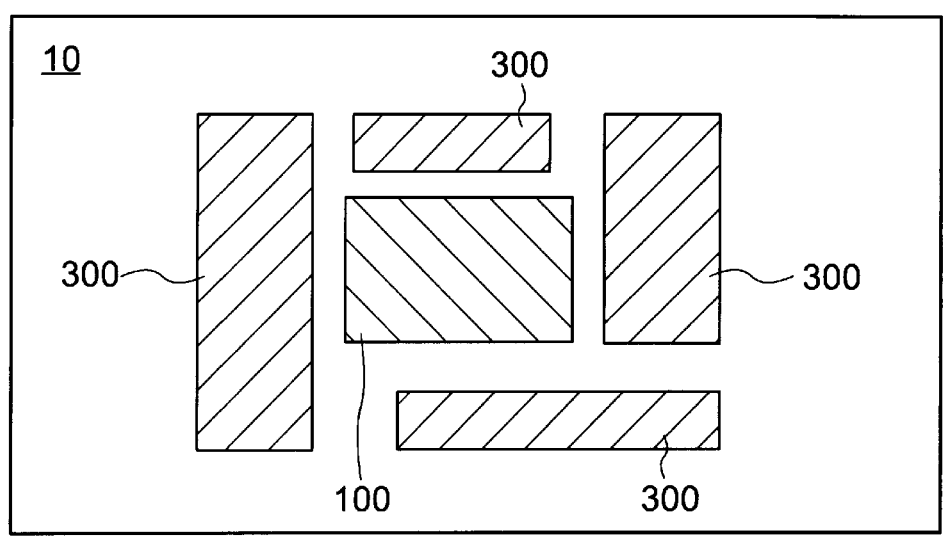
FIG. 2 is a plan view of a semiconductor device according to an embodiment.

FIG. 1 is a cross-sectional view illustrating an overall configuration of a semiconductor device according to an embodiment. FIG. 2 is a plan view illustrating the overall configuration of the semiconductor device according to the embodiment. An example of a semiconductor package using a NAND flash memory will be described as the semiconductor device 10 according to this example embodiment, but the embodiments are not limited thereto. In general, the present disclosure is applicable to any device in which a semiconductor chip is mounted on an interconnection substrate by flip-chip bonding or the like. The semiconductor device 10 includes a semiconductor chip 100, an interconnection substrate 200, a spacer 300, a stacked memory chip 400, a bonding wire 500, and a resin layer 600.

The spacer 300 is adhered on the interconnection substrate 200 via an insulating layer 301. As illustrated in FIG. 2, the spacer 300 is provided on the outer periphery of the semiconductor chip 100 and surrounds the semiconductor chip 100. As illustrated in FIG. 1, an upper surface of the spacer 300 is located at substantially the same height as an upper surface of the semiconductor chip 100. As the spacer 300, a material such as silicon, glass, ceramic, an insulating substrate, or a metal plate can be used. As the insulating layer 301, a die attach film (DAF) can be used, for example. An organic film or coating may be formed on the spacer 300 in order to improve adhesion between the spacer 300 and the stacked memory chip 400. As such an organic film or insulating layer 301, an individual material, a mix, a composite, or stacked organic films of polyimide resin, polyamide resin, epoxy resin, acrylic resin, phenol resin, silicon resin, polybenzoxazole (PBO) resin, benzocyclobutene resin, or the like can be used.

The stacked memory chip 400 is fixed to both the semiconductor chip 100 and the spacer 300. The stacked memory chip 400 includes an insulating layer 410, insulating layers 430, and a memory die 420. The insulating layer 410 is provided on the semiconductor chip 100 and the spacer 300, and the memory die 420 and the insulating layer 430 are alternately stacked on the insulating layer 410. That is, the stacked memory chip 400 is a three-dimensional type memory cell array in which a plurality of memory die 420 are three-dimensionally arranged. The memory dies 420 are stacked with positions thereof being shifted so that the upper memory die 420 expose a portion of the lower memory die 420. As the insulating layers 410 and 430, an individual material, a mix, a composite, or stacked organic films of polyimide resin, polyamide resin, epoxy resin, acrylic resin, phenol resin, silicon resin, polybenzoxazole (PBO) resin, benzocyclobutene resin, or the like can be used. The stacked memory chip 400 may be a vertical stack of just memory dies 420 or interposers with through silicon vias (TSVs) may be provided between different memory dies 420.

A bonding wire 500 electrically connects to a connection pad provided on the upper surface of the stacked memory chip 400 and a connection pad 201 on the interconnection substrate 200. A bonding wire 500 also connects to connection pads on the upper surface each of the memory dies 420 of the stacked memory chip 400. The resin layer 600 covers and protects structures of the semiconductor chip 100, the stacked memory chip 400, the bonding wire 500, and the like provided on an interconnection substrate 200. As the resin layer 600, an organic material such as polyimide resin, polyamide resin, epoxy resin, acrylic resin, phenol resin, silicon resin, polybenzoxazole (PBO) resin, benzocyclobutene resin, or the like can be used either alone or as mixtures. In FIG. 1, the structure in which the stacked memory chip 400 is mounted on the interconnection substrate 200 via spacer is illustrated, but the semiconductor device 10 may instead have the structure in which the memory dies 420 are stacked on a film on device (FOD) structure by using the FOD structure in which a flip-chip chip is covered with resin.

Figure 3:
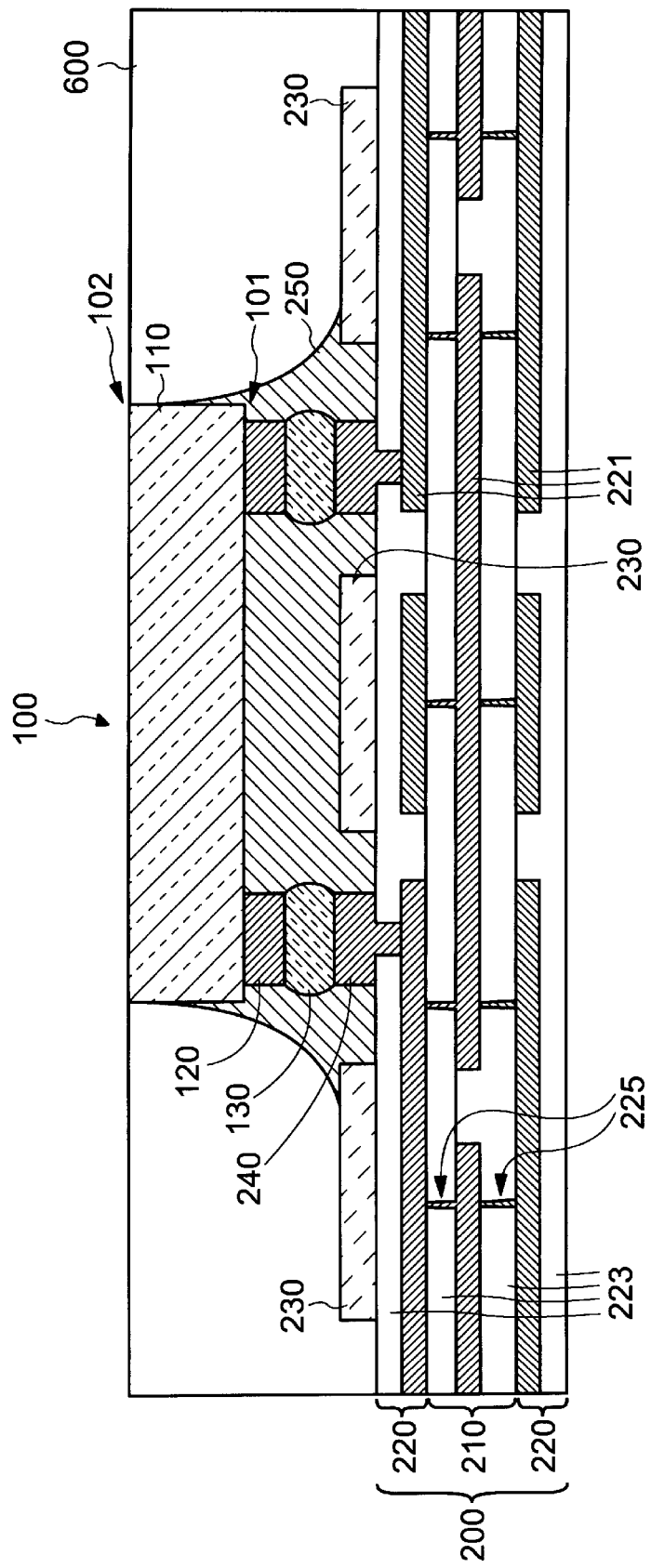
FIG. 3 is a cross-sectional view of a semiconductor chip and an interconnection substrate of a semiconductor device according to an embodiment.
Figure 4:
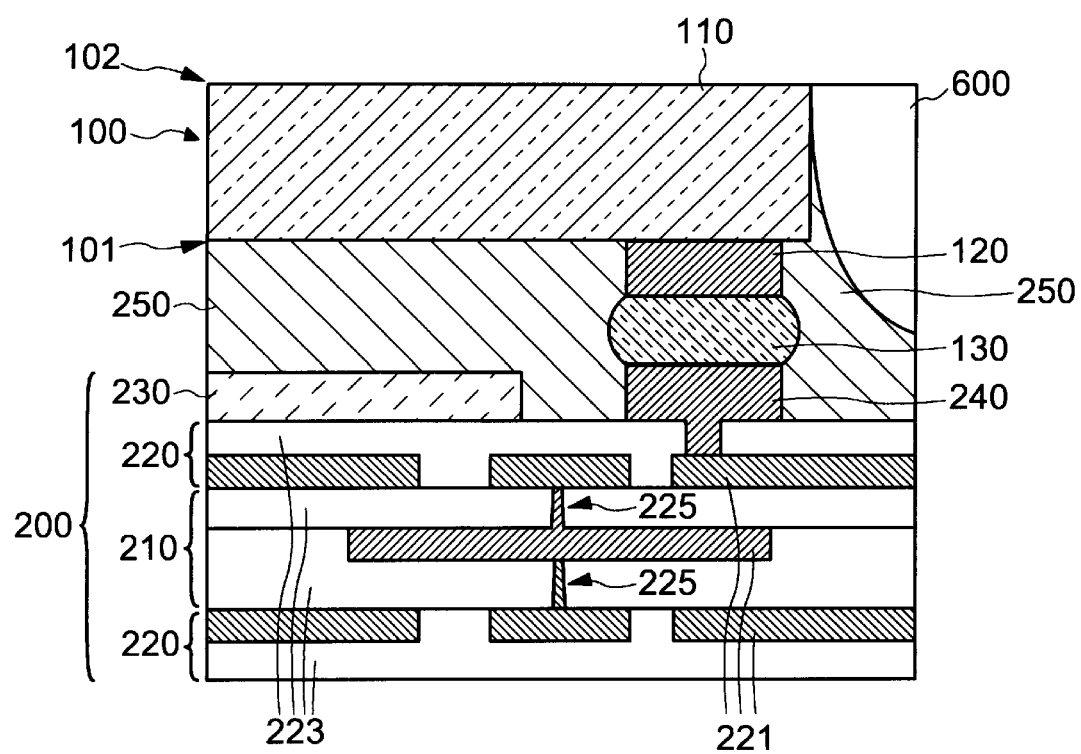
FIG. 4 is a partially enlarged cross-sectional view illustrating a connection structure between a semiconductor chip and an interconnection substrate according to an embodiment.

FIG. 3 is a cross-sectional view illustrating a configuration of a semiconductor chip and an interconnection substrate of a semiconductor device according to the embodiment. FIG. 4 is a partially enlarged cross-sectional view illustrating a connection structure between a semiconductor chip and an interconnection substrate of a semiconductor device according to an embodiment.

As illustrated in FIGS. 3 and 4, the semiconductor chip 100 has a first surface 101 and a second surface 102. The semiconductor chip 100 includes a semiconductor substrate 110, a pad 120, and a metal bump 130. The pad 120 and the metal bump 130 are provided on the first surface 101 side of the semiconductor chip 100. Functional elements such as transistors, capacitors, and resistors are provided on the first surface 101 side of the semiconductor substrate 110. The functional elements are connected to each other by interconnection wiring(s). The interconnection wirings comprise portions of a conductive layers, and the conductive layers adjacent to each other in the thickness direction can be separated from one another by an insulating layer between the conductive layers. An insulating layer can be provided with an opening, and the conductive layers adjacent to each other in the thickness direction can be connected to via the opening.

As an example of the thickness of the semiconductor substrate 110, the thickness is 10 μm to 100 μm, or 20 μm to 70 μm. The pad 120 is provided on or otherwise connected to an interconnection wiring exposed on the first surface 101 side of the semiconductor substrate 110. The metal bump 130 is provided on the pad 120. The pad 120 is connected to a pad 240 via the metal bump 130. The metal bump 130 provides an electrical connection between the pads and a relative positional relationship between the pads.

As the semiconductor substrate 110, a silicon substrate, a gallium arsenide (GaAs) substrate, a silicon carbide (SiC) substrate, or the like is used. As the pad 120, a conductive material such as copper (Cu), nickel (Ni), gold (Au), tin (Sn), silver (Ag), aluminum (Al), titanium (Ti), chromium (Cr), titanium nitride (TiN), chromium nitride (CrN), palladium (Pd), tungsten (W), tantalum (Ta), or molybdenum (Mo) is used. The pad 120 is a single layer, a stacked layer, or an alloy layer of the above-mentioned materials. As the metal bump 130, a conductive material such as solder (e.g., an alloy containing tin as a main component) is used. Examples include a single layer, a stacked layer, or an alloy layer of Sn, Ag, Cu, Ni, Au, Pd, bismuth (Bi), indium (In), antimony (Sb), germanium (Ge), or cobalt (Co). However, the materials are examples, and the embodiments are not limited to the above-mentioned materials.

The interconnection substrate 200 includes a core material 210, an interconnection layer 220, an insulating layer 230, and a pad 240. As an example, the thickness of the interconnection substrate 200 is 30 μm to 1000 μm, or 50 μm to 200 μm. The interconnection layer 220 is provided above and below the core material 210. The insulating layer 230 is provided above the interconnection layer 220. The interconnection layer 220 includes a plurality of conductive layers 221 and a plurality of insulating layers 223. The conductive layers 221 adjacent in the thickness direction are separated by the insulating layer 223 between the conductive layers 221. The insulating layer 223 is provided with an opening 225, and the conductive layer 221 adjacent in the thickness direction can be connected via the opening 225. The pad 240 is connected to the conductive layer 221 closest to the semiconductor chip 100 among the plurality of conductive layers 221 in the interconnection layer 220. An under fill 250 is provided between the semiconductor chip 100 and the interconnection substrate 200. Although not specifically illustrated, another insulating layer 230 may be formed below the interconnection substrate 200. The pad 240 may be formed under the interconnection substrate 200.

As the core material 210, an insulating material such as glass epoxy resin or ceramic (alumina-based or AlN-based) is used. As the conductive layer 221, a conductive material such as Cu, Al, Ti, W, Ta, Ag, Au, or Mo is used. The conductive layer 221 is a single layer, a stacked layer, or alloy layer of the above-mentioned materials. As the insulating layers 223 and 230, an inorganic insulating layer such as silicon oxide ($SiO_2$), silicon nitride (SiN), aluminum oxide ($Al_2O_3$), or aluminum nitride (AlN), or an organic insulating layer such as polyimide resin, polyamide resin, acrylic resin, epoxy resin, silicon resin, fluororesin, siloxane resin, phenol resin, polybenzoxazole (PBO) resin, or benzocyclobutene resin is used. The insulating layers 223 and 230 are single layers, composite layers, or stacked layers of the above-mentioned materials. The insulating layer 230 may be referred to as a solder resist. As the pad 240, a conductive material such as Cu, Ni, Au, Sn, Ag, Pd, Ti, Cr, Mo, TiN, CrN is used. The pad 240 is a single layer, a stacked layer, or an alloy layer of the above-mentioned materials. However, the materials are examples, and the embodiments are not limited to the above-mentioned materials. As the core material 210, a substrate based on silicon or glass such as an interposer may be used.

Method of Manufacturing Semiconductor Device 10

Figure 5:
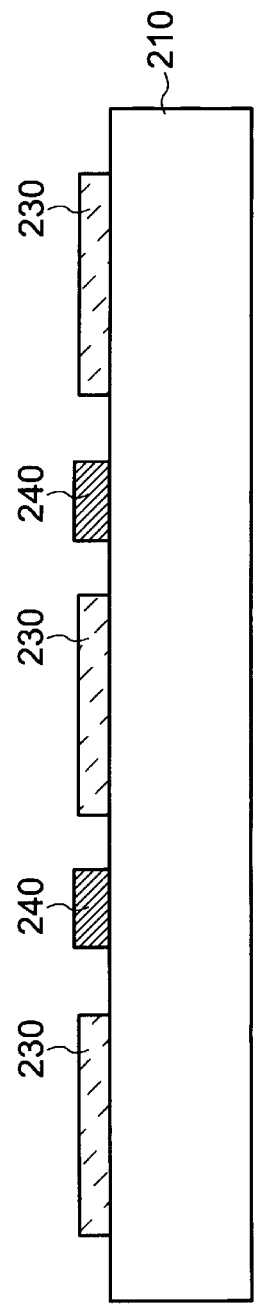
FIG. 5 is a cross-sectional view of an interconnection substrate.
Figure 6:
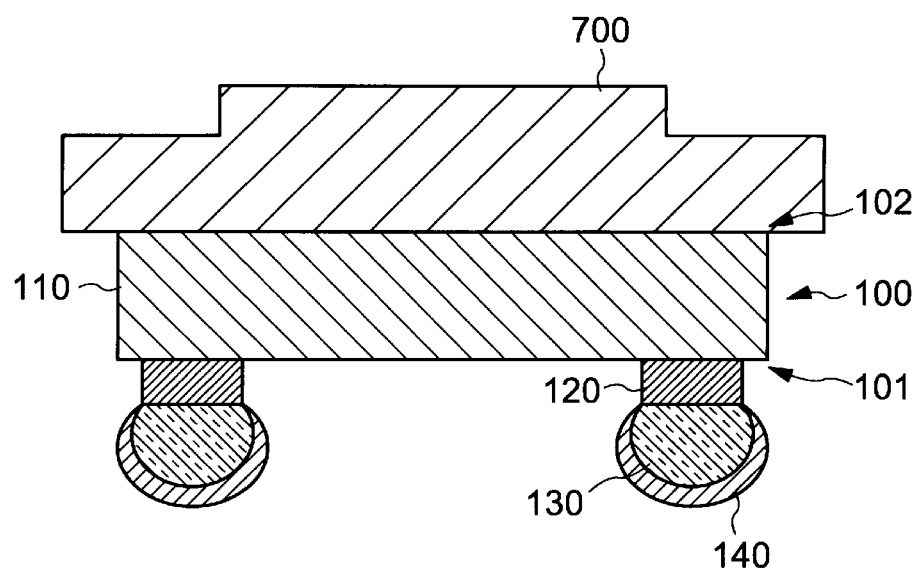
FIG. 6 is a cross-sectional view of a semiconductor chip.

A method of manufacturing the semiconductor device 10 will be described with reference to FIGS. 5 to 15. It is noted that, in the following description, for descriptive clarity, the conductive layer 221 and the insulating layer 223 of the interconnection substrate 200 are omitted from the depictions. As illustrated in FIG. 5, the interconnection substrate 200 is prepared. The pad 240 and the insulating layer 230 are provided above the core material 210. As illustrated in FIG. 6, the semiconductor chip 100 is prepared. The pad 120 and the metal bump 130 are provided on the lower surface side (first surface 101 side) of the semiconductor chip 100. A flux 140 is formed at the tip end (lower end in the drawing) of the metal bump 130. The semiconductor chip 100 is fixed to a handling member 700 of a mounting device. The flux 140 may be formed on the pad 240.

Figure 7:
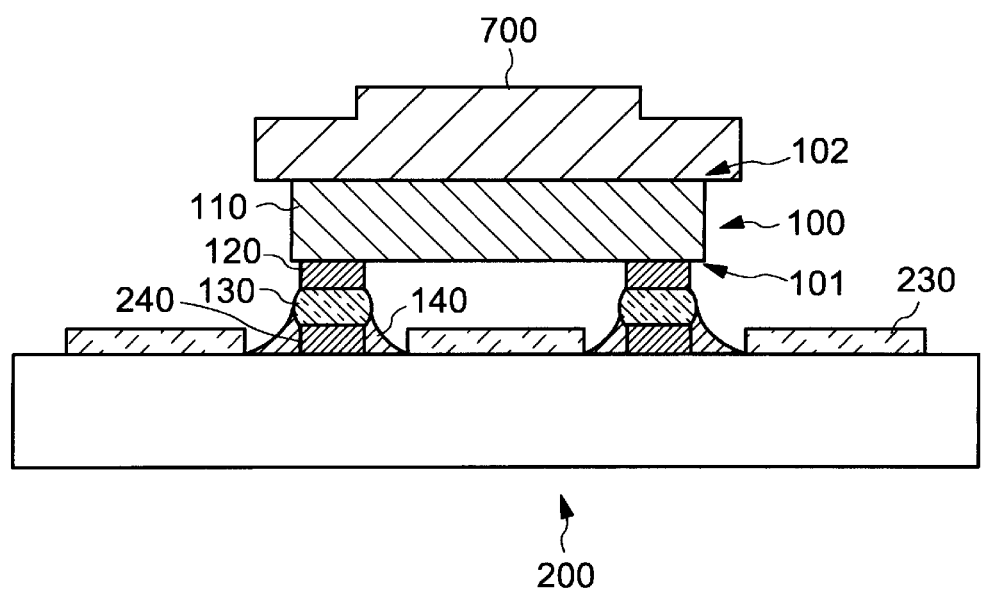
FIGS. 7-15 are cross-sectional views illustrating a method of manufacturing a semiconductor device according to an embodiment.

As illustrated in FIG. 7, the semiconductor chip 100 is placed on the interconnection substrate 200 so that the metal bump 130 is in contact with the pad 240 or at least the flux 140 on the metal bump 130 is in contact with the pad 240. In FIG. 7, since the pad 240 and the metal bump 130 may be in contact with each other, or the pad 240 and the flux 140 on the metal bump 130 may be in contact with each other, when the semiconductor chip 100 is disposed on the interconnection substrate 200, it is possible to use a relatively inaccurate alignment device and alignment method.

Figure 8:
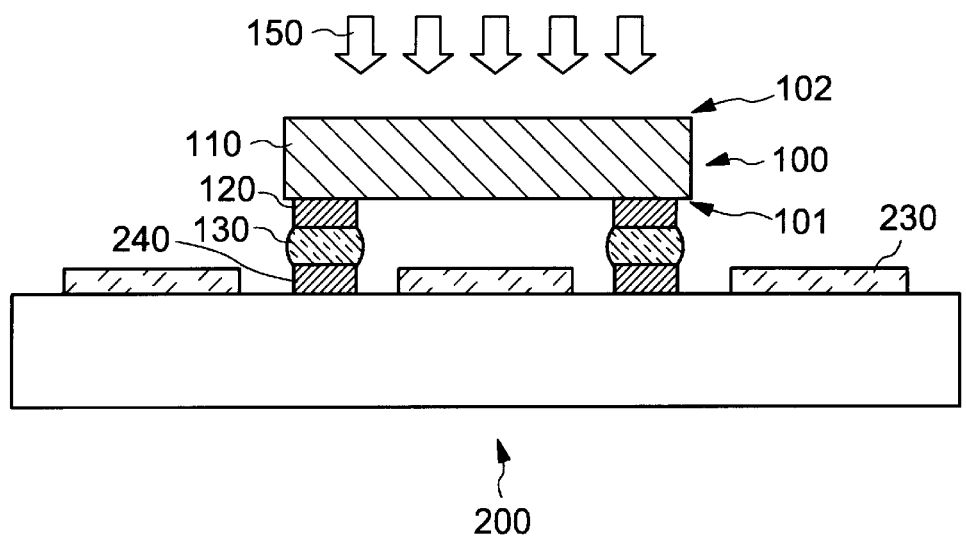

As illustrated in FIG. 8, the application of the first light 150 for melting the metal bump 130 from the upper surface side (second surface 102 side) of the semiconductor chip 100 is performed. The first light 150 (or the second light 160 in some examples described later) transmits through the semiconductor substrate 110 to be reach both the pad 120 and the metal bump 130. In some examples, the first light 150 may applied to the pad 120 but not reach the metal bump 130 since the first light 150 is absorbed strongly by the pad 120. The phrase "the first light 150 (or the second light 160) is applied to the pad 120 and the metal bump 130" refers to both situations of light reaching the metal bump 130 and light not reaching the metal bump 130 but being applied indirectly thereto via the pad 120.

The application condition(s) for the first light 150 is set such the temperature of the metal bump 130 exceeds its melting point of due to heating caused by the first light 150. During the application of the first light 150, no other member for restricting the movement of the semiconductor chip 100 is provided on the second surface 102 side of the semiconductor chip 100. In the present embodiment, a laser beam is used as the first light 150. The wavelength of the laser beam can be 600 nm to 1300 nm, 750 nm to 1200 nm, or 850 nm to 1100 nm. When the wavelength is less than 600 nm, the absorption of light by the semiconductor chip becomes large, and thus, there is a concern that the semiconductor chip may be damaged. When the wavelength exceeds 1300 nm, the effective energy provided by the exposure becomes small, and thus, the temperature of the connection portion does not rise quickly. The application time of the laser beam is, for example, 0.1 seconds to 60 seconds, 0.5 seconds to 30 seconds, or 1 second to 15 seconds. When the application time is less than 0.1 seconds, the temperature may not rise substantially, and when the application time exceeds 60 seconds, there can be a problem in that the manufacturing throughput becomes slow. By using the laser beam of an above-mentioned wavelength as the first light 150, it is possible to prevent the energy of the laser beam from being absorbed significantly by the semiconductor substrate 110, and it is thus possible to efficiently use the energy of the laser beam for heating the metal bump 130.

A light other than a laser beam may be used as the first light 150. For example, lamp light may be used as the first light 150. Additionally, the wavelength of the laser beam used as the first light 150 is not limited to the above-mentioned wavelength ranges.

As described above, when the metal bump 130 is melted by the first light 150, the metal bump 130 exhibits fluidity, so that the semiconductor chip 100 can be moved to an appropriate position due to the surface tension of the melted metal bump 130. Specifically, the semiconductor chip 100 moves to a position where the pad 120 of the semiconductor chip 100 faces the pad 240 of the interconnection substrate 200. As such, by melting the metal bump 130 with the first light 150, self-alignment is performed. It is not necessary to melt all of the plurality of metal bumps 130 provided on the semiconductor chip 100 by the application of the first light 150, and it can be sufficient if at least two metal bumps 130 among the plurality of metal bumps 130 are melted. It is noted that a portion of the flux 140 will generally be volatilized by the application of the first light 150.

Figure 9:
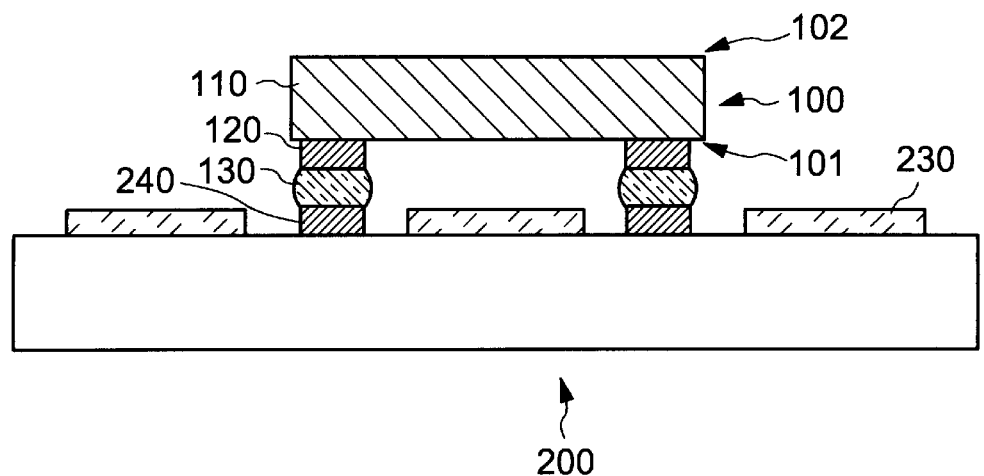

After the self-alignment is performed, as illustrated in FIG. 9, the application of the first light 150 is stopped or lessened. By stopping or lessening the application of the first light 150, the metal bump 130 can begin to dissipate heat. The heat dissipation continues until the temperature of the melted metal bump 130 at least reaches its freezing point (solidification point). When the temperature of the metal bump 130 reaches the freezing point, the melted metal bump 130 becomes solidified, and the position of the semiconductor chip 100 is fixed at the position to which the semiconductor chip 100 moved by self-alignment. For the application of the first light 150 to be stopped or lessened, the output of the light source may be adjusted or a shielding plate (shutter) or an attenuator may be inserted into the optical path of the first light 150.

Figure 10:
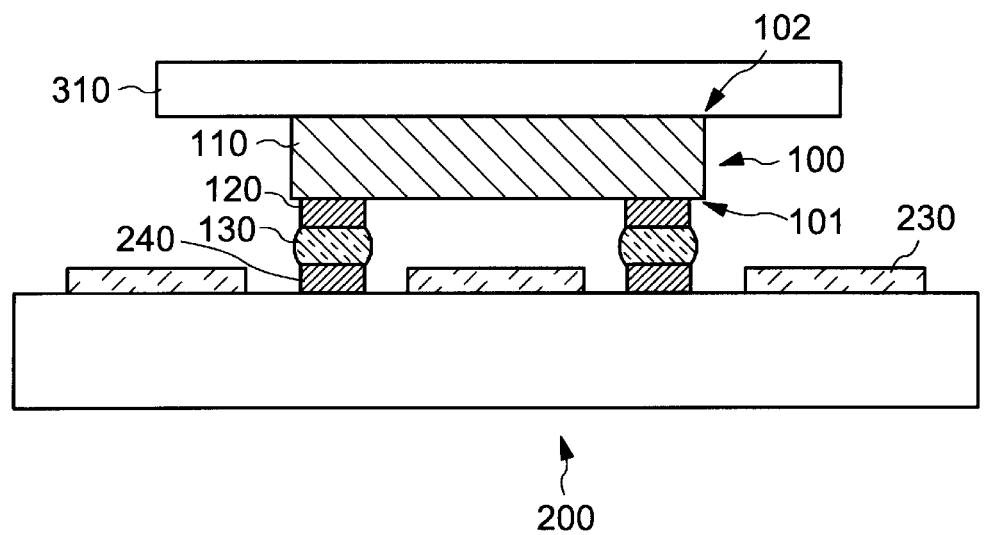

As illustrated in FIG. 10, the support member 310 is disposed on the second surface 102 side of the semiconductor chip 100. The support member 310 is translucent. Specifically, the support member 310 is a member that transmits at least a portion of the second light 160. For example, as the support member 310, glass, quartz, heat-resistant plastic, or the like may be used. The transmittance of the support member 310 with respect to the wavelength of the second light 160 is 80% or more, 90% or more, or 95% or more. When the transmittance of the support member 310 is less than 80%, the temperature cannot be raised efficiently. The support member 310 is in contact with the second surface 102 of the semiconductor chip 100 and presses the semiconductor chip 100 toward the interconnection substrate 200.

Figure 11:
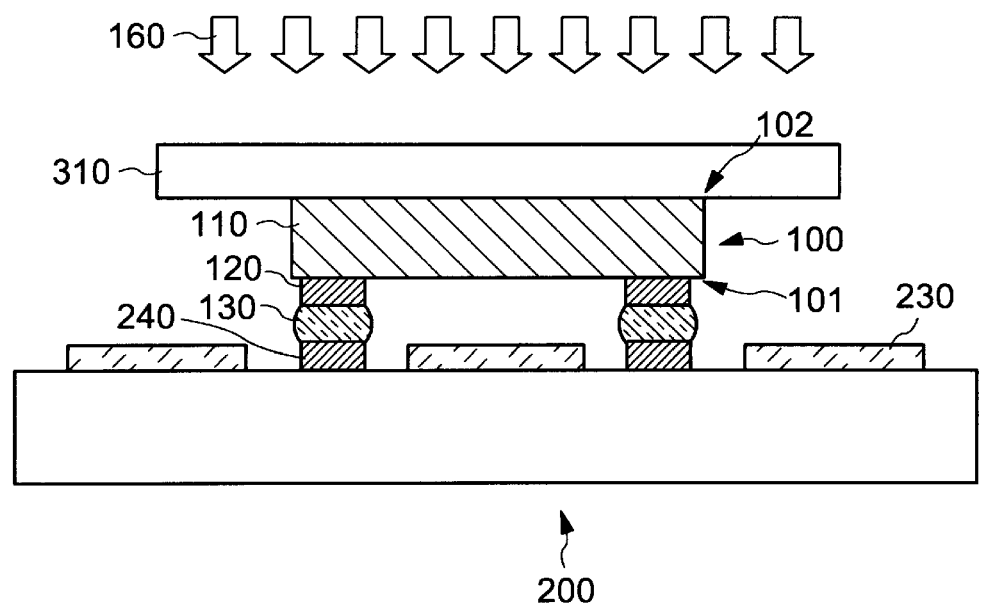

As illustrated in FIG. 11, while the semiconductor chip 100 is being pressed by the support member 310, the application of the second light 160 for melting the metal bump 130 is performed from the upper surface side (second surface 102 side) of the semiconductor chip 100, that is, from above the support member 310. The application condition of the second light 160 is set so that the temperature of the metal bump 130 exceeds its melting point due to heating by the second light 160. In the embodiment, a laser beam is used as the second light 160. The wavelength of the laser beam is 600 nm to 1300 nm, 750 nm to 1200 nm, or 850 nm to 1100 nm. When the wavelength is less than 600 nm, the absorption of light by the semiconductor chip becomes large, and thus, there is a concern that the semiconductor chip may be damaged. When the wavelength exceeds 1300 nm, the effective energy becomes too small, and thus, the temperature of the connection portion does not rise quickly. The application time of the laser beam is 0.1 seconds to 60 seconds, 0.5 seconds to 30 seconds, or 1 second to 15 seconds. When the application time is less than 0.1 seconds, the temperature does not rise significantly, and when the application time exceeds 60 seconds, there is a problem that the throughput becomes slow. By using the laser beam having an above-mentioned wavelength as the second light 160, it is possible to prevent the energy of the laser beam from being absorbed by the semiconductor substrate 110, but it is still possible to efficiently use the energy of the laser beam for heating the metal bump 130. The application energy (or intensity) of the second light 160 may be larger than the application energy (or intensity) of the first light 150.

Light other than a laser beam may be used as the second light 160. For example, lamp light may be used as the second light 160. The wavelength of the laser beam used as the second light 160 is not limited to the above-mentioned wavelengths.

As illustrated in FIGS. 8 and 9, when first light 150 is applied to the pad 120 and the metal bump 130 for the purpose of self-alignment, especially when the semiconductor substrate 110 is thin as described above, the semiconductor chip 100 may be warped. When the application of the first light 150 is performed by using the method illustrated in FIG. 8 when the semiconductor chip 100 is warped, if there is a location where the pad 240 and the metal bump 130 (or flux 140) are not in contact with each other, even though the metal bump 130 might be melted by the first light 150, the metal bump 130 and the pad 240 will not be connected. However, as illustrated in FIG. 11, the warped state of the semiconductor chip 100 can be corrected or compensated for by pressing the semiconductor chip 100 downward with the support member 310 from the second surface 102 side of the semiconductor chip 100. Therefore, the pad 240 and the metal bump 130 can be forced in to contact with each other. Since the application of the second light 160 is performed in such state, even if there is a location where the metal bump 130 and the pad 240 are not initially connected during the application of the first light 150, the metal bump 130 and the pad 240 can be connected by the application of the second light 160.

In the above-mentioned example, the semiconductor chip 100 is pressed by the support member 310, which is in contact with the second surface 102 of the semiconductor chip 100, but the embodiments are not limited to this configuration. For example, another member may be provided between the semiconductor chip 100 and the support member 310. For example, a buffer member may be provided between the semiconductor chip 100 and the support member 310 in order to avoid damage to the semiconductor chip 100 on the second surface 102 side. As the buffer member, a member softer (e.g., having a smaller Young's modulus) than each of the semiconductor substrate 110 and the support member 310 may be used.

Figure 12:
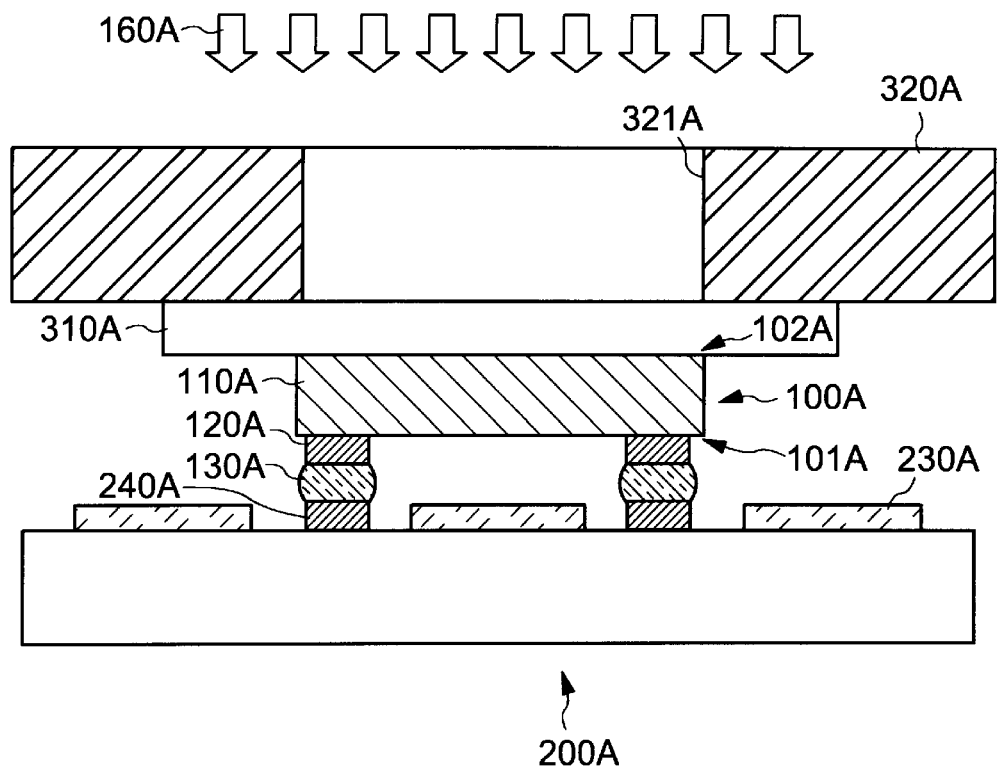

In an above-mentioned example, a method involving applying the first light 150 and the second light 160 only through the support member 310 was illustrated, but the embodiments are not limited to such a method. For example, as illustrated in FIG. 12, the second light 160A may be applied while a mask 320A with an opening 321A formed therein is disposed on a support member 310A. The material comprising the mask 320A does not need to transmit the second light 160A since the opening 321A is provided. Alternatively, the mask 320A can be formed of a material that attenuates the second light 160A to such an extent that an interconnection substrate 200A is not substantially affected by the second light 160A.

The mask 320A blocks the second light 160A outside the planar area of a semiconductor chip 100A when viewed from above. That is, when viewed in a plan view, the opening 321A formed in the mask 320A overlaps the semiconductor chip 100A. Similarly, when viewed in a plan view, the mask 320A covers the region of the interconnection substrate 200A not overlapped by the semiconductor chip 100A. However, when viewed in a plan view, the opening 321A at least overlaps a metal bump 130A. According to the above-mentioned configuration, it is possible to prevent portions of the interconnection substrate 200A left exposed by the semiconductor chip 100A from being heated by the application of the second light 160A. The mask 320A protects the interconnection substrate 200A which might have characteristics that could be changed by exposure to the second light 160A. However, a portion of the interconnection substrate 200A may be left exposed from both the semiconductor chip 100A and the mask 320A in some examples.

The mask 320A may be used not only in the process of applying the second light 160A but also in the process of applying the first light 150.

Figure 13:
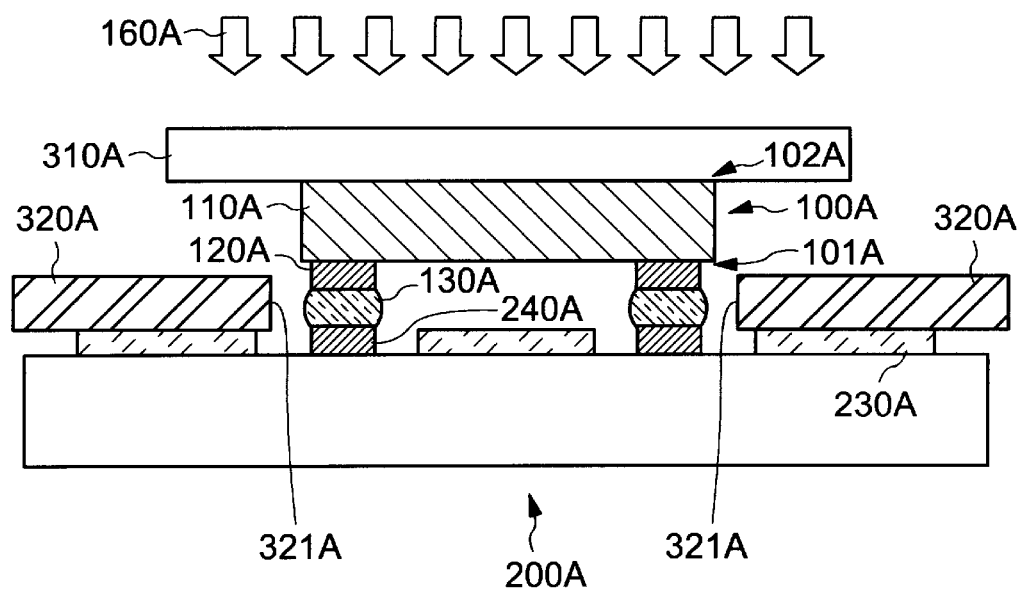

An example in which the mask 320A is disposed on the semiconductor chip 100A side (second surface 102A side of the semiconductor chip 100A) was illustrated, but as illustrated in FIG. 13, the mask 320A may be arranged on the interconnection substrate 200A side (interconnection substrate 200A side from the second surface 102A of the semiconductor chip 100A). Alternatively, masks may be arranged on both the semiconductor chip 100A side (as illustrated in FIG. 12) and the interconnection substrate 200A side (as illustrated in FIG. 13).

Figure 14:
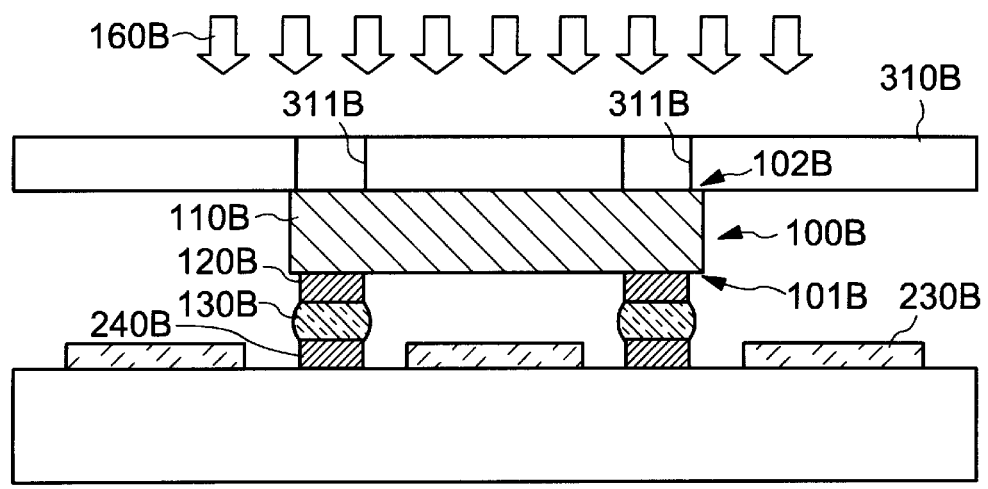

In the example of FIG. 11, the configuration in which the entire second surface 102 of the semiconductor chip 100 is in contact with the support member 310 is illustrated, but the embodiments are not limited to this configuration. As illustrated in FIG. 14, a semiconductor chip 100B may be pressed by using a support member 310B having an opening 311B or openings 311B. When viewed in a plan view, an opening 311B overlaps a metal bump 130B. A plurality of the openings 311B may be provided corresponding to the respective plurality of metal bumps 130B, or just one opening 311B for all of the plurality of metal bumps 130B, collectively, may be provided. In the latter case, only the outer peripheral portion of the semiconductor chip 100B is in contact with the support member 310B. A member that does not transmit the second light 160 may be used as the support member 310B in such a case. For example, as in the mask 320A of FIG. 12, the support member 310B may attenuate second light 160B to the extent that the second light 160B does not affect an interconnection substrate 200B.

The support member 310B may be used not only in the process of applying the second light 160B but also in the process of applying the first light 150.

Figure 15:
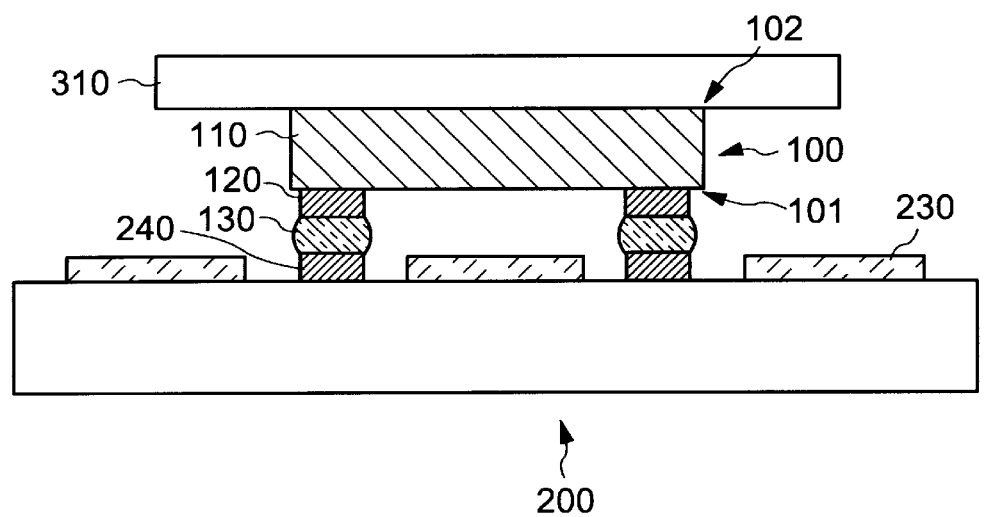

After the metal bump 130 is melted by the application of the second light 160, the application of the second light 160 is stopped or reduced. By stopping or reducing the application of the second light 160, the metal bump 130 begins to dissipate heat, and the heat dissipation continues until at least the temperature of the melted metal bump 130 reaches its freezing point. By allowing the temperature of the metal bump 130 to reach the freezing point or less, the melted metal bump 130 is solidified, and a structure in which the metal bump 130 and the pad 240 are connected is obtained, as illustrated in FIG. 15. When the application of the second light 160 is to be stopped or reduced, the output of the light source may be adjusted, or a shielding plate, an attenuator, or the like may be provided in the optical path of the second light 160.

After the metal bump 130 and the pad 240 are connected by the application of the second light 160, a residue of flux 140 can be removed by a cleaning process, and the then underfill 250 is formed between the semiconductor chip 100 and the interconnection substrate 200. As the underfill 250a material such as polyimide resin, polyamide resin, epoxy resin, acrylic resin, phenol resin, silicon resin, polybenzoxazole (PBO) resin, benzocyclobutene resin, or the like can be used or mixtures thereof can be used. Then, the resin layer 600 that covers the interconnection substrate 200, the semiconductor chip 100, and the underfill 250 is formed.

In an above-mentioned manufacturing method, a method in which the first light 150 is applied to the pad 120 and the metal bump 130 without using a support member 310 was described, but the embodiments are not limited to such a method. For example, the support member 310 may be arranged above the semiconductor chip 100 without being in contact with the semiconductor chip 100, and the first light 150 may be applied to the pad 120 and the metal bump 130 by transmission through the support member 310. When a buffer member is located between the semiconductor chip 100 and the support member 310 as described above, the support member 310 and the buffer member may be pressed against the pad 120 and the metal bump 130.

Method of Applying First Light 150 and Second Light 160

Figure 16:
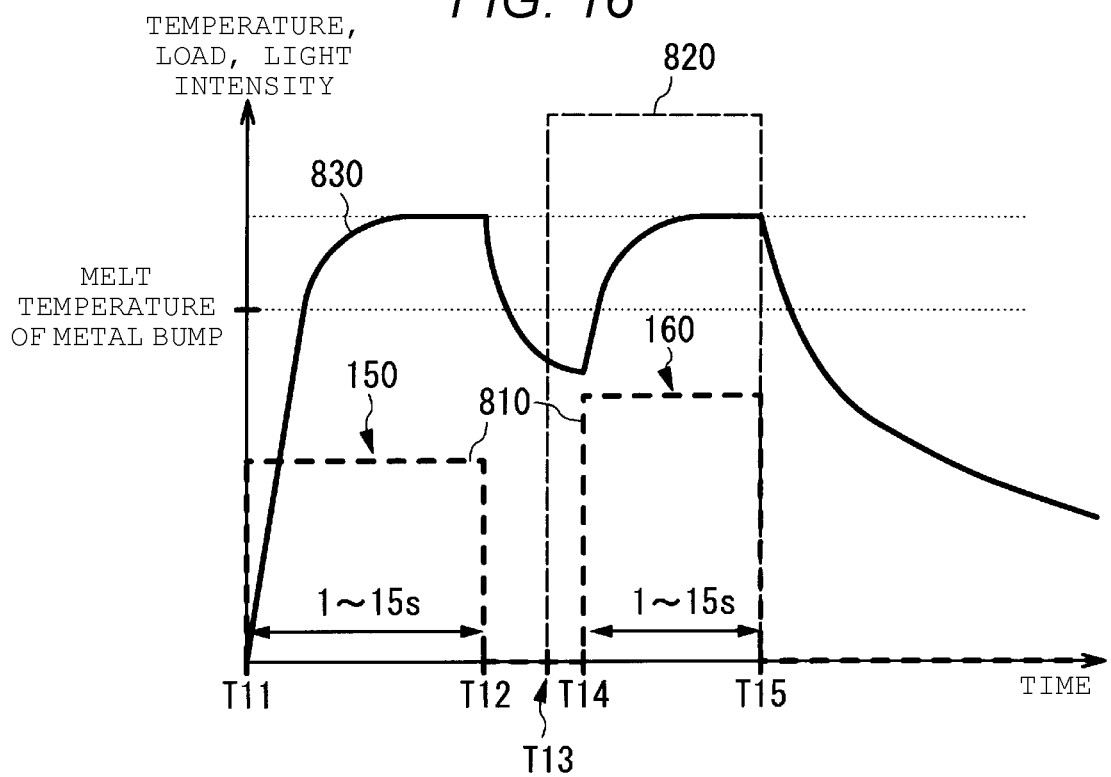

A method of applying the first light 150 and the second light 160 will be described with reference to FIG. 16. FIG. 16 is a timing chart illustrating a method of connecting the metal bump and the pad by application of light for the manufacturing of a semiconductor device according to an embodiment. The horizontal axis of FIG. 16 indicates time, and the vertical axis indicates relative values for light intensity, loads, or temperature. In FIG. 16, a first graph line 810 illustrates the intensities of the first light 150 and the second light 160, a second graph line 820 illustrates the pressure with which the semiconductor chip 100 is pressed toward the interconnection substrate 200 by the support member 310, and a third graph line 830 illustrates the temperature of the metal bump 130.

As illustrated in FIG. 16, at time T11, the first light 150 begins to be applied to the pad 120 and the metal bump 130. By the metal bump 130 absorbing the energy of the first light 150, the temperature of the metal bump 130 rises, and when the temperature exceeds the melting point of the metal bump 130, the metal bump 130 is melted. By melting the metal bumps 130, self-alignment of the semiconductor chip 100 is performed. After the self-alignment is performed, at time T12, the application of the first light 150 is stopped or reduced. After the application of the first light 150 is stopped or reduced, the temperature of the metal bump 130 gradually decreases due to the heat dissipation. Then, when the temperature of the metal bump 130 reaches the freezing of the metal bump 130, the melted metal bump 130 is solidified, and the semiconductor chip 100 is fixed at a position determined by the self-alignment process.

Subsequently, at time T13, the semiconductor chip 100 is pressed toward the interconnection substrate 200 by using the support member 310. By this pressing, the metal bump 130 and the pad 240 are forced into contact with each other. Then, at time T14, the second light 160 begins to be applied to the pad 120 and the metal bump 130. By the metal bump 130 absorbing the energy of the second light 160, the temperature of the metal bump 130 rises, and thus, when the temperature exceeds the melting point of the metal bump 130, the metal bump 130 is melted again. After that, at time T15, the application of the second light 160 is stopped or reduced. When the application of the second light 160 is stopped or reduced, the temperature of the metal bump 130 gradually decreases due to the heat dissipation, and thus, the melted metal bump 130 resolidifies. In the example embodiment, the application of the second light 160 is stopped or reduced at time T15, and the pressing of the semiconductor chip 100 by the support member 310 is also stopped at this time T15. The intensity of the second light 160 is higher than the intensity of the first light 150 in this example.

As described above, even if the semiconductor substrate 110 is warped and the metal bump 130 is not connected to the pad 240 in the application of the first light 150, the semiconductor chip 100 is pressed by the support member 310 during the application of the second light 160. Therefore, by the application of the second light 160, the metal bump 130 at the previously unconnected location is melted while the metal bump 130 is being pressed into contact with the pad 240. As a result, the metal bump 130 and the pad 240 can be connected. Before the application of the second light 160, the flux 140 may be applied again to a region between the semiconductor chip 100 and the interconnection substrate 200.

Variation Example of Method of Applying First Light 150 and Second Light 160

An example where the application of the second light 160 is performed after the semiconductor chip 100 is pressed by the support member 310 was illustrated above, but as illustrated in FIG. 17, the time (T13) of the pressing of the semiconductor chip 100 and the time (T14) of the application of the second light 160 may be the same. The processing time can be shortened by performing the pressing and the application of the second light 160 at the timing illustrated in FIG. 17.

Alternatively, as illustrated in FIG. 18, after the pressing (at time T13) of the semiconductor chip 100, the application of the second light 160 is started (at time T14), the application of the second light 160 is then stopped (at time T15) or reduced in intensity, and after that, the pressing of the semiconductor chip 100 may be ended (at time T16). By performing the pressing and the application of the second light 160 at the timing illustrated in FIG. 18, it is possible to more reliably connect the metal bump 130 to the pad 240.

Figure 17:
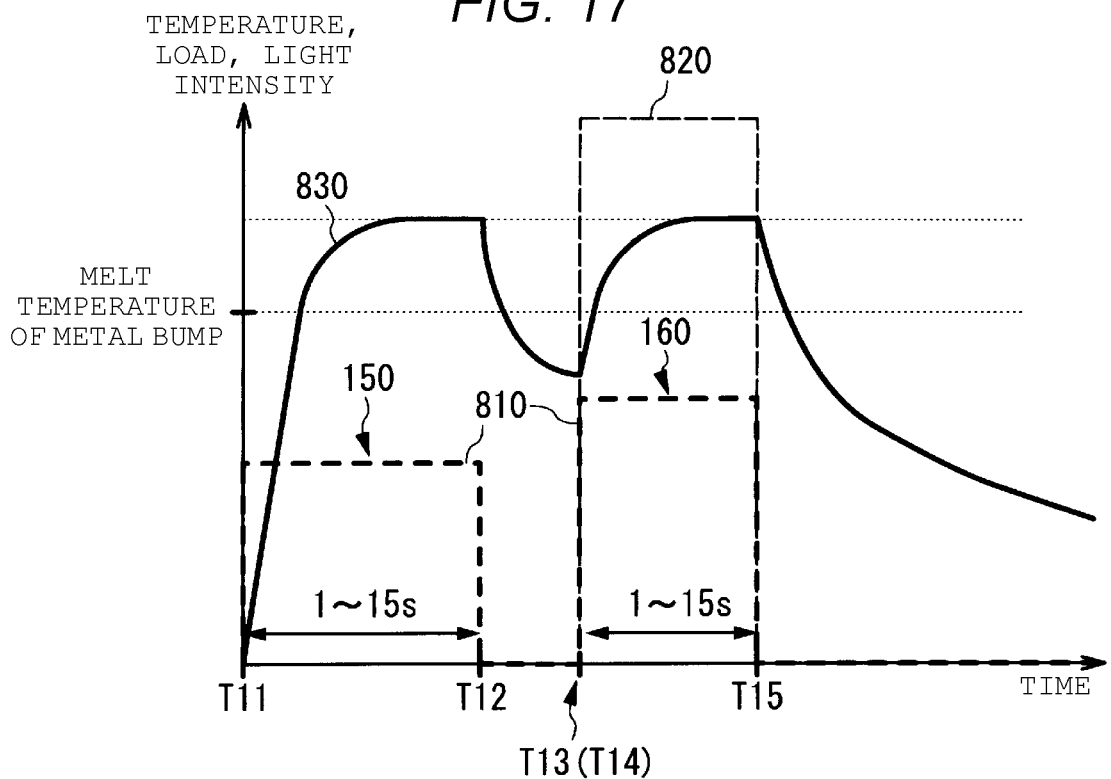

In the examples of FIGS. 16 to 18, control of the magnitude of the force for pressing the support member 310 is illustrated, but the embodiments are not limited to this. For example, as illustrated in FIG. 19, control may be performed to maintain the positions (heights) of the support member 310 and the semiconductor chip 100 that are moveable with the pressing. The fourth graph 840 illustrated in FIG. 19 illustrates the positions (heights) of the support member 310 and the semiconductor chip 100. As illustrated in FIG. 19, at time T13, the semiconductor chip 100 is pressed by the support member 310 to move toward the interconnection substrate 200 (downward in FIG. 19), and the positions (height) of the support member 310 and the semiconductor chip 100 are maintained until time T16. By applying the second light 160 in the meantime, the same effect as described above can be obtained. Since the position (height) of the semiconductor chip 100 is maintained together with the support member 310, the gap between the semiconductor chip 100 and the interconnection substrate 200 can be kept constant.

As described above, according to the method of manufacturing the semiconductor device according to the first embodiment, it is possible to perform high-accuracy alignment in flip-chip bonding without using a high-cost apparatus with high positioning accuracy, and furthermore, it is possible to provide a mounting method of an IC chip capable of reducing the effects that are otherwise the result of a warped state of the IC chip.

Second Embodiment

Figure 20:
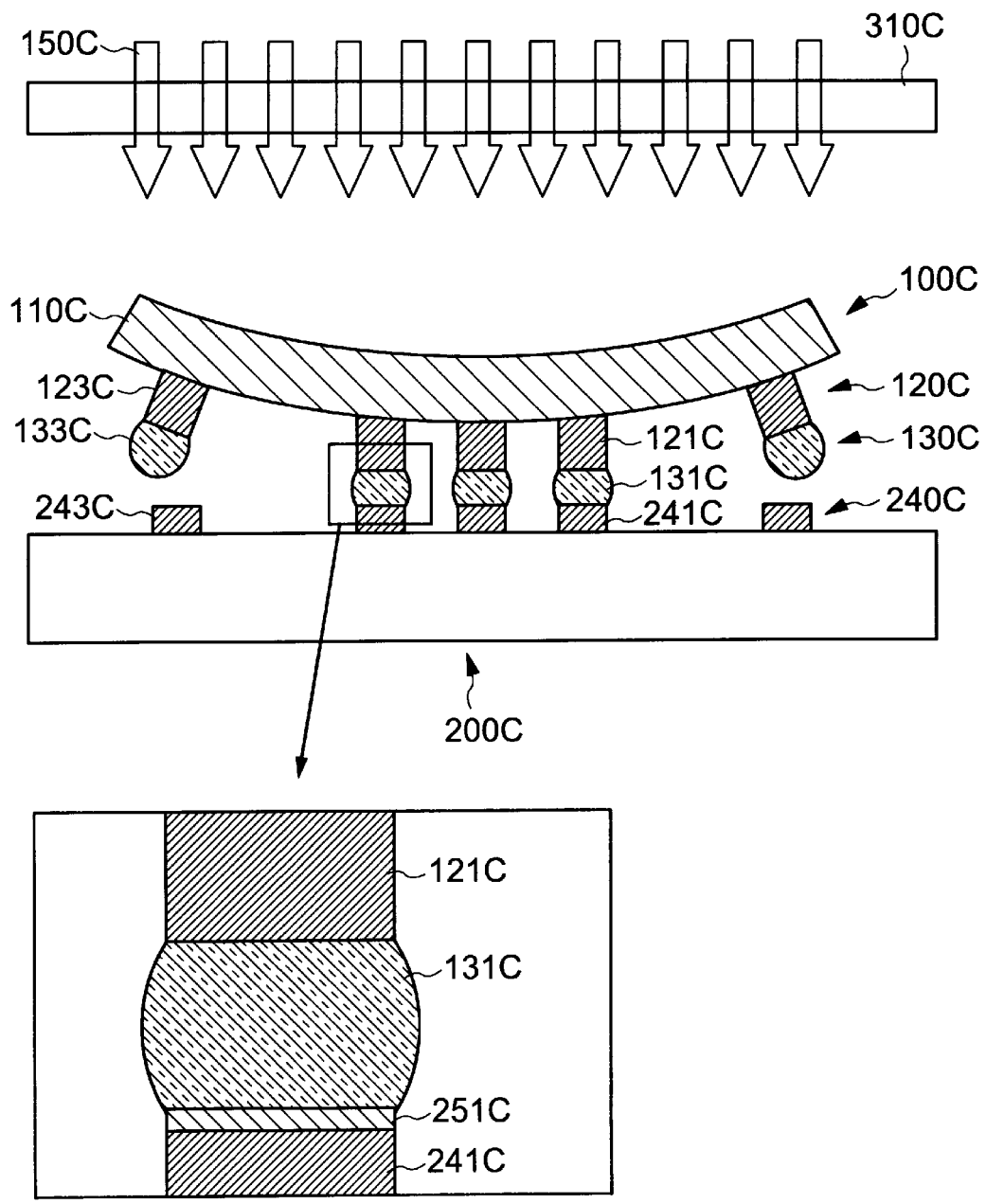
FIGS. 20-22 are cross-sectional views illustrating aspects related to a method of manufacturing a semiconductor device.
Figure 21:
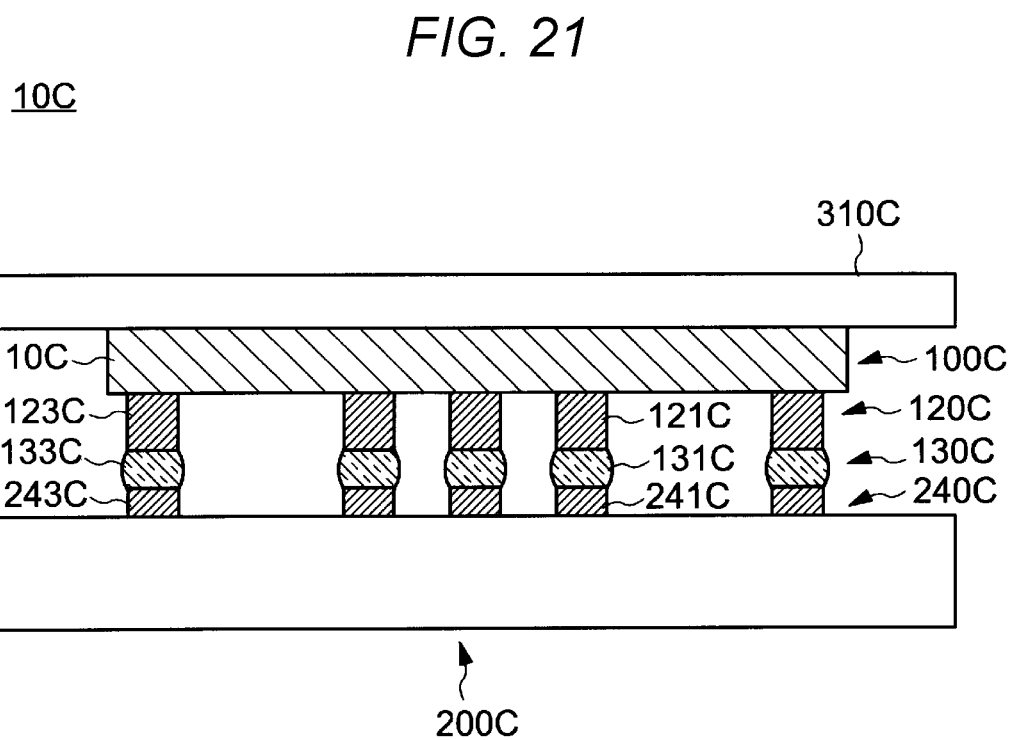
Figure 22:
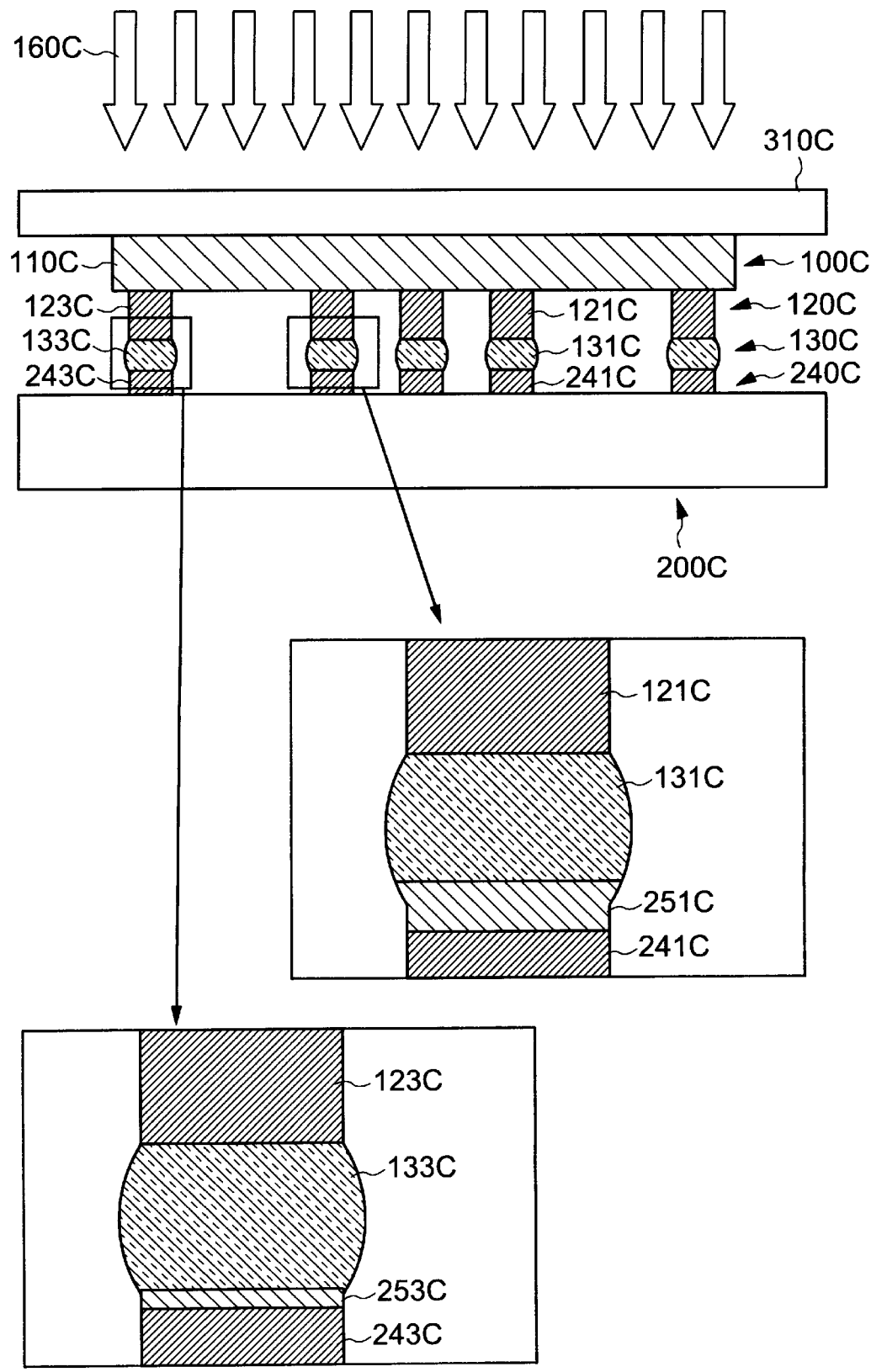

A semiconductor device 10C and a method of manufacturing the semiconductor device 10C according to the second embodiment will be described with reference to FIGS. 20 to 22. The semiconductor device 10C according to the second embodiment is similar to the semiconductor device 10 according to the first embodiment, but the semiconductor device 10C is different from the semiconductor device 10 in that a pad 120C, a metal bump 130C, and a pad 240C are provided. In the following description, aspects of the configuration similar to that of the first embodiment will not be further described, and the aspects different from that of the first embodiment will be mainly described. FIGS. 20 to 22 are cross-sectional views illustrating the method of manufacturing the semiconductor device according to the embodiment.

As illustrated in FIG. 20, the various pads 120C include a first pad 121C and a second pad 123C. The various metal bumps 130C include a first metal bump 131C and a second metal bump 133C. The various pads 240C include a first pad 241C and a second pad 243C. A first metal bump 131C is provided on a first pad 121C. A second metal bump 131C is provided on a second pad 123C. A first metal bump 131C is connected to a first pad 241C. A second metal bump 133C is connected to a second pad 243C. When the semiconductor chip 100C is viewed in a plan view, the first pad 121C, the first metal bump 131C, and the first pad 241C are provided more centrally within the planar area of the semiconductor chip 100 than are the second pad 123C, the second metal bump 133C, and the second pad 243C. In other words, the second pad 123C, the second metal bump 133C, and the second pad 243C are provided nearer the outer periphery of the semiconductor chip 100C. For example, when the semiconductor chip 100C is rectangular, the second pad 123C, the second metal bump 133C, and the second pad 243C might be provided at the corners of the semiconductor chip 100C.

The process of FIG. 20 is generally the same as the process illustrated in FIG. 8 of the first embodiment. However, in FIG. 20, unlike in FIG. 8, first light 150C is transmitted through a support member 310C that is separated from the semiconductor chip 100C (that is, not in contact with the semiconductor chip 100C), and the first light 150C is thereby applied to the pad 120C and the metal bump 130C. The semiconductor chip 100C has a stacked structure in which insulating layers and conductive layers are stacked on the semiconductor substrate 110C. When the thickness of the semiconductor substrate 110C is thin, the rigidity of the semiconductor substrate 110C is low, and thus, the semiconductor chip 100C may be warped due to the combined stress of the insulating layers and the conductive layers stacked on the semiconductor substrate 110C. In this embodiment, an example where the thickness of the semiconductor substrate 110C is 10 μm to 100 μm or 20 μm to 70 μm, is illustrated and thus the semiconductor chip 100C is warped. In the example of FIG. 20, the combined stress is a compressive stress, and an example where the semiconductor chip 100C is curved in a convex shape on its lower surface is illustrated.

As illustrated in FIG. 20, when the application of the first light 150C is performed in this embodiment, the first metal bump 131C is in contact with the first pad 241C, but the second metal 133C is not in contact with the second pad 243C due to the warping of the semiconductor chip 100C. When the application of the first light 150C is performed in such state, the first metal bump 131C and the second metal bump 133C are melted by the application energy of the first light 150C, but self-alignment is performed based only on the first metal bumps 131C and the first pads 241C that are in contact with each other. By stopping or reducing the application of the first light 150C after this self-alignment, the first metal bump 131C is solidified at the position resulting from the self-alignment is, so that the position of the semiconductor chip 100C with respect to an interconnection substrate 200C is now fixed.

A partial enlarged view of a first pad 121C, a first metal bump 131C, and a first pad 241C is illustrated in the lower portion of FIG. 20. The partial enlarged view depicts a state where the first metal bump 131C has been melted by the application of the first light 150C and is now connected to the first pad 241C. As illustrated in the partial enlarged view in FIG. 20, a first compound layer 251C is formed between the first metal bump 131C and the first pad 241C. The first compound layer 251C is formed by the alloying of the first metal bump 131C and the first pad 241C due to the heat generated by the application of the first light 150C. That is, the first compound layer 251C is a layer containing some material of the first metal bump 131C and some material of the first pad 241C. Specifically, the first compound layer 251C is, for example, an alloy containing Ni and Sn, or an alloy containing Cu and Sn.

The process of FIG. 21 is generally the same as the process illustrated in FIG. 10 for the first embodiment. By pressing the semiconductor chip 100C toward the interconnection substrate 200C with the support member 310C, the warped state of the semiconductor chip 100C is corrected. That is, the outer peripheral portion of the semiconductor chip 100C is pressed toward the interconnection substrate 200C by the support member 310C. As a result, the second pad 123C and the second metal bump 133C are pressed toward the second pad 243C, and the second metal bump 133C makes contact with the second pad 243C as illustrated in FIG. 21.

Subsequently, as illustrated in FIG. 22, second light 160C is applied to the pads 120C and the metal bumps 130C in the state illustrated in FIG. 21 (in the state where the semiconductor chip 100C is pressed by the support member 310C). The first metal bump 131C was already connected (fixed) to the first pad 241C in a prior process, but now the second metal bump 133C is in contact with the second pad 243C due to the pressing of the support member 310C. Therefore, both of the first metal bump 131C and the second metal bump 133C are melted by the application of the second light 160C, so that the first metal bump 131C and the second metal bump 133C are connected to the first pad 241C and the second pad 243C, respectively. After that, by stopping or reducing the application of the second light 160C, the first metal bump 131C and the second metal bump 133C are solidified. As a result, the first metal bump 131C is connected to the first pad 241C, and the second metal bump 133C is connected to the second pad 243C.

A first partial enlarged view of the first pad 121C, the first metal bump 131C, and the first pad 241C and a second partial enlarged view of the second pad 123C, the second metal bump 133C, and the second pad 243C are illustrated in the lower portion of FIG. 22. The first partial enlarged view is similar to the partial enlarged view illustrated in FIG. 20, but since the reaction of the first compound layer 251C further proceeds by the application of the second light 160C, the thickness of the first compound layer 251C is larger as compared with that of FIG. 20. The second partial enlarged view is a view illustrating a state where the second metal bump 133C has been melted by the application of the second light 160C and connected to the second pad 243C. As illustrated in the second partial enlarged view, a second compound layer 253C is formed between the second metal bump 133C and the second pad 243C. The second compound layer 253C is formed by an alloying of the second metal bump 133C and the second pad 243C in the heat generated by the application of the second light 160C. That is, the second compound layer 253C is a layer containing some material of the second metal bump 133C and some material of the second pad 243C. Specifically, similarly to the first compound layer 251C the second compound layer 253C is, for example, an alloy containing Ni and Sn, or an alloy containing Cu and Sn.

As illustrated in the first partial enlarged view and the second partial enlarged view of FIG. 22, the thickness of the first compound layer 251C is larger than the thickness of the second compound layer 253C. This is because the first compound layer 251C was formed by applying light two different times, that is, the application of the first light 150C and the application of the second light 160C. In some cases, the compound layer thus formed may be more fragile than the metal bump and the pad. Here, since the thickness of the compound layer is smaller on the outer side than on the inner side of the semiconductor chip 100C, it is possible to prevent the breakage caused by the compound layer.

Since the semiconductor chip 100C is curved downward in a convex shape in this example, the thickness of the first compound layer 251C is larger than the thickness of the second compound layer 253C, but the embodiments are not limited to such a configuration.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a semiconductor chip having a first metal bump in a central region and a second metal bump in an outer peripheral region outside the central region when viewed in a plan view; and
    an interconnection substrate having a first pad connected to the first metal bump and a second pad connected to the second metal bump, wherein
    a first compound layer comprising a material of the first metal bump and a material of the first pad is between the first metal bump and the first pad,
    a second compound layer comprising a material of the second metal bump and a material of the second pad is between the second metal bump and the second pad, and
    a thickness of the first compound layer and a thickness of the second compound layer are different from each other.

2. The semiconductor device according to claim 1, wherein the thickness of the first compound layer is greater than the thickness of the second compound layer.

3. The semiconductor device according to claim 2, wherein
    the semiconductor chip is rectangular in plan view, and
    the second metal bump is provided at a corner of the semiconductor chip.

4. The semiconductor device according to claim 1, wherein
    the first compound layer is an alloy containing nickel and tin, and
    the second compound layer is an alloy containing nickel and tin.

5. The semiconductor device according to claim 1, wherein
    the first compound layer is an alloy containing copper and tin, and
    the second compound layer is an alloy containing copper and tin.

* * * * *